(12) United States Patent
Xu et al.

(10) Patent No.: US 8,298,927 B2
(45) Date of Patent: Oct. 30, 2012

(54) METHOD OF ADJUSTING METAL GATE WORK FUNCTION OF NMOS DEVICE

(75) Inventors: Qiuxia Xu, Beijing (CN); Gaobo Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/057,336

(22) PCT Filed: Sep. 21, 2010

(86) PCT No.: PCT/CN2010/001457
§ 371 (c)(1),
(2), (4) Date: Feb. 3, 2011

(87) PCT Pub. No.: WO2011/143798
PCT Pub. Date: Nov. 24, 2011

(65) Prior Publication Data
US 2011/0287620 A1    Nov. 24, 2011

(30) Foreign Application Priority Data

May 19, 2010   (CN) .......................... 2010 1 0183450

(51) Int. Cl.
*H01L 21/3205* (2006.01)
(52) U.S. Cl. .......... 438/591; 438/45; 438/157; 438/301; 257/369; 257/412; 257/E21.294
(58) Field of Classification Search .............. 438/5–13, 438/45, 157, 174, 176, 181, 194, 195, 197, 438/199, 218, 231, 246–252, 267, 276, 283, 438/289, 301–306, 322, 369, 371–375, 418, 438/420, 433, 449, 495, 502, 509, 514–534, 438/540, 550, 585–596, 659–664, 676, 679, 438/795–799, 914–925, 934, FOR. 242, FOR. 334; 257/369, 371, 412, E21.077, E21.082, E21.12, 257/E21.135–E21.153, E21.176–E21.186, 257/E21.297, E21.324, E21.333, E21.347, 257/E21.374, E21.454, E21.458, E21.475, 257/E21.497, E21.596, E21.621–E21.624, 257/E21.635–E21.638, E33.075; 427/598–600
See application file for complete search history.

(56) References Cited

U.S. PATENT DOCUMENTS
5,310,699 A * 5/1994 Chikawa et al. .............. 438/614
(Continued)

FOREIGN PATENT DOCUMENTS
CN    101800196    8/2010

OTHER PUBLICATIONS

Ren, C.; Chan, D.S.H.; Faizhal, B.B.; Li, M.-F.; Yeo, Y.-C.; Trigg, A.D.; Agarwal, A.; Balasubramanian, N.; Pan, J.S.; Lim, P.C.; Kwong, D.-L. "Lanthanide-Incorporated Metal Nitrides with Tunable Work Function and Good Thermal Stability for NMOS Devices" VLSI Technology, 2005. Digest of Technical Papers, pp. 42-43, 2005.*

(Continued)

*Primary Examiner* — Hsien Ming Lee
*Assistant Examiner* — Walter H Swanson
(74) *Attorney, Agent, or Firm* — Westman, Champlin & Kelly, P.A.

(57) ABSTRACT

A method of adjusting a metal gate work function of an NMOS device comprises: depositing a layer of metal nitride film or metal film on a high K dielectric as a metal gate electrode by a physical vapor deposition process; implanting elements such as Tb, Er, Yb or Sr into the metal gate electrode by an ion implantation process; performing a high temperature annealing so that the doped metal ions are driven to and accumulate on the interface between the metal gate electrode and the high K gate dielectric, or form dipoles by an interface reaction on the interface between the high K gate dielectric and $SiO_2$. The method is capable of adjusting the metal gate work function, and is well-compatible with CMOS process.

11 Claims, 2 Drawing Sheets

U.S. PATENT DOCUMENTS

| | | | |
|---|---|---|---|
| 5,471,363 A * | 11/1995 | Mihara | 361/305 |
| 5,846,921 A * | 12/1998 | Gil et al. | 510/175 |
| 6,355,532 B1 * | 3/2002 | Seliskar et al. | 438/283 |
| 7,531,399 B2 | 5/2009 | Yen et al. | 438/199 |
| 7,897,452 B2 * | 3/2011 | Kazama et al. | 438/234 |
| 2004/0155353 A1 * | 8/2004 | Koike et al. | 257/760 |
| 2007/0048984 A1 | 3/2007 | Walther et al. | 438/533 |
| 2008/0146013 A1 * | 6/2008 | Ino et al. | 438/592 |
| 2008/0191286 A1 * | 8/2008 | Chang et al. | 257/369 |
| 2009/0315125 A1 * | 12/2009 | Yen et al. | 257/411 |
| 2010/0038725 A1 * | 2/2010 | Chudzik et al. | 257/392 |
| 2011/0169104 A1 * | 7/2011 | Xu et al. | 257/410 |
| 2011/0254060 A1 * | 10/2011 | Yang et al. | 257/288 |
| 2011/0256701 A1 | 10/2011 | Xu et al. | 438/586 |

OTHER PUBLICATIONS

Wahab, Q.; Sardela, M. R.; Hultman, L.; Henry, A.; Willander, M.; Janzen, E.; Sundgren, J.-E "Growth of high-quality 3C-SiC epitaxial films on off-axis Si(001) substrates at 850 C by reactive magnetron sputtering" Applied Physics Letters, vol. 65 Issue:6, pp. 725-727 (1994).*

Ono, H.; Ushiku, Y.; Yoda, T. Development of a planarized Al-Si contact filling technology VLSI Multilevel Interconnection Conference, 1990. Proceedings., Seventh International IEEE, pp. 76-82.*

H. Y. Yu; C. Ren; W. Y. Loh; C. X. Zhu; Albert Chin; A. D. Trigg; S. Biesemans; G. Q. Lo; D. L. Kwong; Xin Peng Wang. "Work Function Tunability by Incorporating Lanthanum and Aluminum into Refractory Metal Nitrides and a Feasible Integration Process." 8th International Conference on Solid-State and Integrated Circuit Technology, 2006, pp. 424-426.*

Chi Ren; Chan, D.S.H.; Ming-Fu Li; Wei-Yip Loh; Balakumar, S.; Chih Hang Tung; Balasubramanian, N.; Dim-Lee Kwong Work Function Tuning and Material Characteristics of Lanthanide-Incorporated Metal Nitride Gate Electrodes for NMOS Device Applications IEEE Transactions on Electron Devices (2006), vol. 53, No. 8, pp. 1877-1884.*

Study on characteristics of thermally stable HfLaON gate dielectric with TaN metal gate Qiuxia Xu, Gaobo Xu, Wenwu Wang, Dapeng Chen, Shali Shi, Zhengsheng Han, and Tianchun Ye, Appl. Phys. Lett. 93, 252903 (2008).*

Written Opinion and Search Report for related Application PCT/CN2010/001457; Sep. 21, 2010 and May 19, 2010; 12 pages.

"Gallium-Incorporated TiN Metal Gate With Band-Edge Work Function and Excellent Thermal Stability for PMOS Device Applications", by Qiuxia Xu et al., *IEEE*, vol. 32, No. 9, Sep. 2011.

* cited by examiner

METHOD OF ADJUSTING METAL GATE WORK FUNCTION OF NMOS DEVICE

CROSS-REFERENCE TO RELATED APPLICATION

This Application is a Section 371 National Stage Application of International Application No. PCT/CN2010/001457, filed Sep. 21, 2010, not yet published, the contents of which are hereby incorporated by reference in their entirety.

BACKGROUND OF THE INVENTION

1. Field of Invention

The present invention relates to semiconductor technique, and more particularly, to a method of adjusting a metal gate work function of an NMOS device, which can be used for fabricating a high performance complementary metal-oxide-semiconductor (CMOS) device of 45 nanometers and beyond.

2. Description of Prior Art

As a feature size of a CMOS device reaches 45 nm and beyond, it is well known in the art that a conventional $SiO_2$/poly-Si (polycrystalline silicon) gate stack structure needs to be replaced with a high K (dielectric constant)/metal gate stack structure, so as to significantly reduce tunneling current and resistance of the gate, to eliminate a depletion effect of the polycrystalline silicon gate, to improve reliability of the device, and to alleviate a Fermi level pinning effect. However, there are many challenges in integration of the metal gate with the high K dielectric, such as challenges regarding thermal stability and interfacial states. Specifically, the Fermi level pinning effect results in a big challenge in a nano CMOS device which should have an appropriately low threshold voltage.

SUMMARY OF THE INVENTION

An object of the present invention is to provide a method of adjusting a metal gate work function of an NMOS device to obtain an appropriate work function, so as to achieve an appropriate threshold voltage.

To achieve the above object, there provides a method of adjusting a metal gate work function of an NMOS device, comprises:

step 1) forming an interfacial oxide layer of SiOx or SiON after formation of a device isolation, wherein the interfacial oxide layer of SiOx or SiON is formed by rapid thermal oxidation at a temperature of 600-900° C. for 20-120 s;

step 2) forming a high dielectric constant gate dielectric film by a PVD process, wherein, a HfLaON film is deposited by alternately sputtering a Hf—La target and a Hf target, or a HfSiON gate dielectric is deposited by alternately sputtering a Hf target and a Si target, by means of magnetic-controlled reactive sputtering;

step 3) performing rapid thermal annealing after depositing of the high dielectric constant gate dielectric film, wherein the rapid thermal annealing is performed at a temperature of 600-1050° C. for 10-120 s;

step 4) forming a metal gate electrode by a PVD process, wherein a metal nitride gate is sputtered and deposited by magnetic-controlled reactive sputtering;

step 5) doping the metal nitride gate by implanting N-type metal ions;

step 6) etching to form the metal gate electrode;

step 7) performing thermal annealing at a temperature of 350-1050° C.;

step 8) forming a back ohmic contact by a PVD process, wherein an Al—Si film is deposited at the back side by direct current sputtering;

step 9) forming alloy, in which annealing for alloying is performed in an oven filled with $N_2$ or ($N_7$+10% $H_2$) at a temperature of 380-450° C. for 30-60 minutes.

In step 1) of the adjusting method, after the formation of the device isolation and before formation of the interfacial oxide layer, wafers are cleaned by a conventional cleaning method, and then immersed into a mixed solution of hydrofluoric acid/isopropyl alcohol/water at room temperature, following by washing with deionized water and spin drying, and the interfacial oxide layer is formed immediately performed after the spin drying.

In step 1) of the adjusting method, the mixed solution of hydrofluoric acid/isopropyl alcohol/water has a volume ratio of about 0.2-1.5%:0.01-0.10%:1%, and an immersion time is 2-10 minutes.

In step 2) of the adjusting method, the interfacial oxide layer of SiON is formed by implanting nitrogen into silicon substrate before performing rapidly thermal oxidation, or by performing oxidation followed by plasma nitridation.

In step 2) of the adjusting method, the high dielectric constant gate dielectric film is sputtered in a mixed gas of $N_2$/Ar; and the ratio of respective elements and the film thickness can be adjusted by changing power and time for alternately sputtering the Hf—La target and the Hf target, or the Hf target and the Si target.

In step 4) of the adjusting method, the metal nitride gate is made of TiN, or TaN, or MoN and is formed respectively by reactive sputtering a Ti target, a Ta target or a Mo target, respectively, in the mixed gas of $N_2$/Ar.

In step 5) of the adjusting method, the implanting metal ions for an NMOS device are selected from the group comprising Tb, Er, Yb and Sr.

In step 6) of the adjusting method, the metal gate electrode is made of TlN or TaN and is formed by Cl-based reaction ion etching, or by chemical wet etching.

In step 7) of the adjusting method, the thermal annealing may be performed by annealing adapted for a gate-first process, for example, a rapid thermal annealing, or a spike annealing, or a laser annealing at a temperature of 950-1200° C. for 5 ms-30 s, or by annealing adapted for a gate-last process, for example, an annealing in an oven at a temperature of 350-550° C. for 20-60 minutes.

In step 8) of the adjusting method, the Al—Si film has a thickness of 80-120 nm.

The present invention utilizes the ion implantation method to implant metal ions into the metal gate electrode. After the rapid thermal annealing, the ions accumulate on the interface between the metal gate and the high K gate dielectric, or dipoles are generated by interface reaction on the interface between the high K gate dielectric and $SiO_2$, so as to adjust the metal gate work function and achieve an appropriate low threshold voltage. The method is very simple, and has good thermal stability and good capability of adjusting the metal gate work function, and is completely compatible with the conventional CMOS process. Thus, the method is convenient for the industrialization of the integrated circuit.

DETAILED DESCRIPTION OF PREFERRED EMBODIMENTS

In the present invention, the physical vapor deposition (PVD) method is utilized to deposit a layer of metal nitride film or metal film on the high K dielectric, such as HfLaOH, HfSiON, as the metal gate electrode. And, the ion implantation method is used to dope the metal gate electrode. The implanted metal ions for the NMOS device are selected from the group comprising Tb, Er, Yb and Sr. Then, the doped metal ions can be driven to and accumulate on the interface between the metal gate electrode and the high K gate dielectric by a high temperature annealing, or dipoles may be generated by interface reaction on the interface between the high K gate dielectric and $SiO_2$. As a result, the gate work function can be changed, dependent on types of the metal gate material and the doped ions, a profile of concentration, and an interface reaction status. An appropriate gate work function can be obtained by optimizing energy, dose and heat treatment condition for the ion implantation, so as to provide an appropriate threshold voltage. This method is simple and convenient to be implemented, and may be widely used. Also, the method has strong capability of adjusting the metal gate work function, and is well-compatible with CMOS process.

Figure 1:
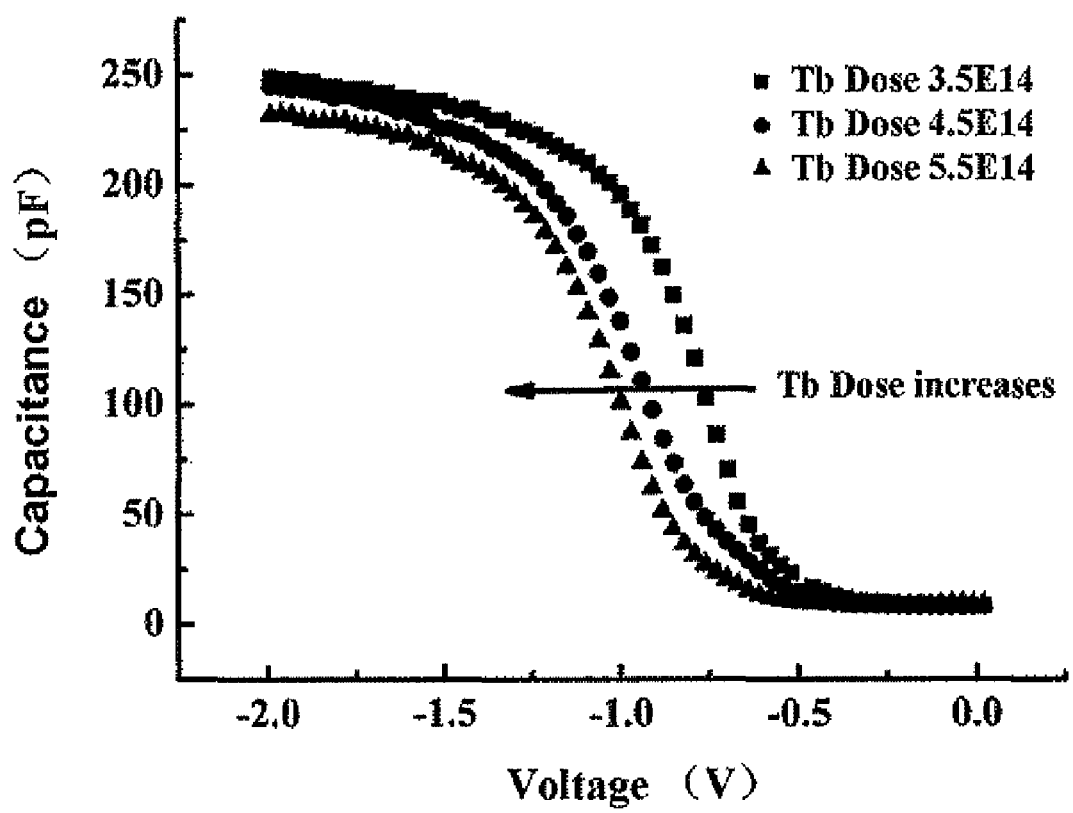
FIG. 1 shows comparison of high frequency C-V characteristic of the NMOS capacitance with gate structure of TiTbN/HfLaON/ILSiO$_2$/N (100) Si and having different Tb contents in a metal gate TiTbN, with different Tb implantation doses used.

FIG. 1 shows comparison of high frequency C-V characteristic of the NMOS capacitance with gate structure of TiTbN/HfLaON/ILSiO$_2$/N (100) Si and having different Tb contents in a metal gate TiTbN, with different Tb implantation doses used. As shown in FIG. 1, with an increase of the Tb implantation dose, the C-V characteristic curve moves towards a negative direction significantly, which indicates that a flat band voltage moves towards the negative direction significantly, i.e. the work function of the NMOS device is greatly reduced.

Figure 2:
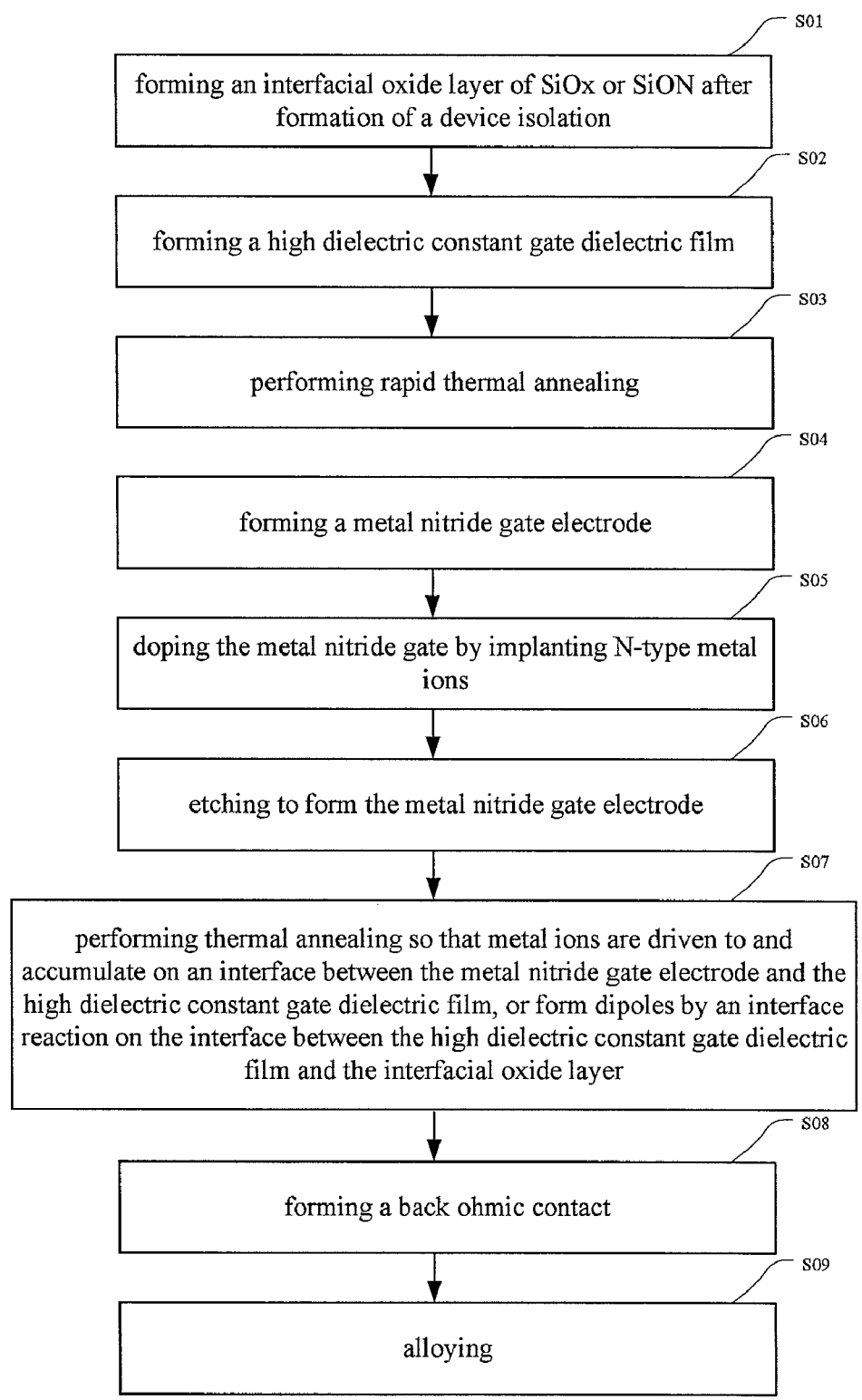
FIG. 2 shows a flowchart illustrating a method of adjusting a metal gate work function of an NMOS device according to one embodiment of the present invention.

FIG. 2 shows a flowchart illustrating a method of adjusting a metal gate work function of an NMOS device according to one embodiment of the present invention. The method according to the present invention comprises:

step 1): cleaning, in which the wafers are cleaned after the formation of the device isolation and before the formation of the interface oxide layer. Firstly, the conventional cleaning method is used. Then, the wafers are immersed into the solution of hydrofluoric acid/isopropyl alcohol/water at room temperature, followed by deionized water washing and spin drying, and then the wafers are moved into an oven. The solution of hydrofluoric acid/isopropyl alcohol/water has a volume ratio of about 0.2-1.5%:0.01-0.10%:1%. The immersion time is 0.5-8 minutes;

step 2): forming an interfacial layer of SiOx or SiON, wherein the rapid thermal annealing is performed at a temperature of 600-900° C. for 20-120 seconds (step S01);

step 3): forming a high dielectric constant (K) gate dielectric film by a PVD process, wherein a HfLaON film is deposited as a gate dielectric by alternately sputtering a Hf—La target and a Hf target, or a HfSiON film is deposited as a gate dielectric by alternately sputtering a Hf target and a Si target, by magnetic-controlled reactive sputtering (step S02), and the sputtering power or time for the alternate sputtering is changed to provide the high K dielectric films different concentration ratios and thickness;

step 4): performing rapid thermal annealing at a temperature of 600-1050° C. for 4-120 seconds after the depositing of the high k dielectric (step S03);

step 5): forming a metal gate electrode by a PVD process, in which a metal nitride gate, such as TiN, TaN, MoN, and the like, is deposited by magnetic-controlled reactive sputtering (step S04);

step 6): doping the metal nitride gate by implanting N-type metal ions (step S05), such as Tb, Er, Yb or Sr;

step 7): forming the metal gate electrode by Cl-based reactive ion etching (step S06);

step 8): performing high temperature rapid thermal annealing at a temperature of 500-1050° C. for 2-30 seconds (step S07);

step 9): forming a back ohmic contact by a PVD process (step S08), wherein an Al—Si film on the back side is deposited by direct current sputtering, the thickness of the film is 80-120 nm; and step 10): alloying in $N_2$ or ($N_2$+10% $H_2$) in an oven at a temperature of 380-450° C. for 30-60 minutes (step S09).

Hereinafter, the method will be further described in detail in conjunction with embodiments of the present invention.

In step 1 of cleaning, the wafers are cleaned after the formation of the device isolation and before the formation of the interface oxide layer. Firstly, a conventional cleaning method is used. Then, the wafers are immersed into a mixed solution of hydrofluoric acid/isopropyl alcohol/water having a volume ratio of about 0.3-0.8%:0.01-0.08%:1% at room temperature for 2-10 minutes, then are washed in deionized water, and then dried by spinning in $N_2$ and moved into an oven immediately.

In step 2 of forming the interfacial layer of SiOx, rapid thermal annealing (RTA) is performed at a temperature of 600-800° C. for 20-120 seconds, to provide an oxide layer having a thickness of 5-7 angstroms.

In step 3 of forming the high dielectric constant (K) gate dielectric film by a PVD process, HfLaON is formed by alternately sputtering a Hf—La target and a Hf target in a mixed gas of $N_2$/Ar, by magnetic-controlled reactive sputtering, wherein the operation pressure for the sputtering is $5\times10^{-3}$ torr, the sputtering power is 100-500 W, and the thickness of the deposited high k gate dielectric film of HfLaON is 10-40 angstroms.

In step 4 of cleaning, the wafers are cleaned by ultrasonic waves in acetone and absolute alcohol for 5-10 minutes, respectively, then are washed in deionized water, and then are dried by spinning in $N_2$.

In step 5 of performing rapid thermal annealing after the depositing of the high k dielectric, after being dried by spinning, the wafers are moved into an oven immediately at a temperature of 600-1000° C. for 10-120 seconds.

In step 6 of the metal nitride gate film deposition, the TiN metal gate film is formed by sputtering the Ti target in the mixed gas of $N_2$/Ar by magnetic-controlled reactive sputtering, wherein the operation pressure is $5\times10^{-3}$ torr, the flow rate of $N_2$ is 2-8 sccm, the sputtering power is 600-1000 W, and the thickness of the TiN film is 5-100 nm.

In step 7 of ion implantation of Tb, the implantation energy is 10 Kev-120 Kev, and the implantation dose is $2\times10^{14}$-$6\times10^{15}/c^2$.

In step 8 of etching metal gate electrode of TiTbN, the Cl-based reactive ion etching is used for forming patterns of metal gate electrode of TiTbN, wherein the RF power is 100-400 W.

In step 9 of rapid thermal annealing, the rapid thermal annealing is performed at a temperature of 700-1050° C. for 2-30 seconds with the protection of $N_2$ for a gate-first process.

In step 10 of forming a back ohmic contact by a PVD process, the Al—Si film having a thickness of 60-100 nm is deposited on the back side by direct current sputtering in an Ar gas.

In step 11 of alloying, the alloying process is performed at a temperature of 380-450° C. for 30-60 minutes, with the protection of $N_2$ gas or ($N_2$+10% $H_2$).

Table 1 shows variations of the flat band voltage with the change of the Tb implantation dose. When the Tb implantation dose is less than 5.5E14 cm$^{-2}$, the flat band voltage is significantly moved towards the negative direction by 0.38V compared with the case without Tb doping. The method of the present invention is effective and well satisfies the requirements of the NMOS device.

TABLE 1

| Tb Injection Dose (cm$^{-2}$) | 0 | 3.5E14 | 4.5E14 | 5.5E14 |
|---|---|---|---|---|
| Flat Band Voltage (V) | −0.5 | −0.662 | −0.770 | −0.882 |

What is claimed is:

1. A method of adjusting an effective work function of a metal nitride gate of an NMOS device, comprising:
    step 1) forming an interfacial oxide layer of SiOx or SiON after formation of a device isolation, wherein the interfacial oxide layer of SiOx or SiON is formed by rapid thermal oxidation at a temperature of 600-900° C. for 20-120 s;
    step 2) forming a high dielectric constant gate dielectric film by a PVD process, wherein by means of magnetic-controlled reactive sputtering, a HfLaON film is deposited as a gate dielectric by alternately sputtering a Hf—La target and a Hf target, or a HfSiON film as a gate dielectric is deposited by alternately sputtering a Hf target and a Si target;
    step 3) performing rapid thermal annealing at a temperature of 600-1050° C. for 10-120 seconds after deposition of the high dielectric constant gate dielectric film;
    step 4) forming a metal nitride gate electrode by a PVD process, wherein a metal nitride gate is sputtered and deposited by magnetic-controlled reactive sputtering;
    step 5) doping the metal nitride gate by implanting N-type metal ions into the metal nitride gate electrode, but not into the high dielectric constant gate dielectric film;
    step 6) etching to form a pattern of the metal nitride gate electrode;
    step 7) performing thermal annealing at a temperature of 350-1050° C. so that metal ions are driven to and accumulate at an interface between the metal nitride gate electrode and the high dielectric constant gate dielectric film and at an interface between the high dielectric constant gate dielectric film and the interfacial oxide layer, wherein the metal ions at the interface between the metal nitride gate electrode and the high dielectric constant gate dielectric film modify properties of the metal nitride gate so as to tune the effective work function, and the metal ions at the interface between the high dielectric constant gate dielectric film and the interfacial oxide layer to orm dipoles by interface reaction so as to further tune the effective work function;
    step 8) forming a back ohmic contact by a PVD process, wherein an Al—Si film is deposited at a back side of the NMOS device by direct current sputtering; and
    step 9) alloying, in $N_2$ or ($N_2$+10% $H_2$) in an oven at a temperature of 380-450° C. for 30-60 minutes.

2. The method according to claim 1, wherein in step 1), after the formation of the device isolation and before formation of the interface oxide layer, wafers are cleaned by a conventional cleaning method and then immersed into a mixed solution of hydrofluoric acid/isopropyl alcohol/water at room temperature, followed by deionized water washing and spin drying, and the interfacial oxide layer is formed immediately after the spin drying.

3. The method according to claim 2, wherein in step 1), the mixed solution of hydrofluoric acid/isopropyl alcohol/water has a volume ratio of about 0.2-1.5%:0.01-0.10%:1%, and an immersion time is 2-10 minutes.

4. The method according to claim 1, wherein in step 2), the interfacial oxide layer of SiON is formed by nitrogen implanting into silicon substrate and followed by rapid thermal oxidation, or by oxidation and followed by plasma nitridation.

5. The method according to claim 1, wherein in step 2), the high dielectric constant gate dielectric film is sputtered in a mixed gas of $N_2$/Ar; and ratios of respective elements and film thickness can be adjusted by changing power and time for alternately sputtering the Hf—La target and the Hf target.

6. The method according to claim 1, wherein in step 4), and the metal nitride gate is made of TiN, TaN, or MoN and is formed by reactive sputtering a Ti target, or a Ta target or a Mo target in a mixed gas of $N_2$/Ar.

7. The method according to claim 1, wherein in step 5), the metal ions are ones selected from a group consisting of Tb, Er, Yb and Sr.

8. The method according to claim 1, wherein in step 6), the metal nitride gate electrode is made of TiN or TaN and etched by Cl-based reactive ion etching or chemical wet etching.

9. The method according to claim 1, wherein in step 7), the thermal annealing is performed by annealing adapted for a gate-first process, including rapid thermal annealing, or spike annealing, or laser annealing at a temperature of 950-1050° C. for 5 ms-30 s, or by annealing adapted for a gate-last process, including annealing in an oven at a temperature of 350-550° C. for 20-60 minutes.

10. The method according to claim 1, wherein in step 8), the Al—Si film has a thickness of 80-120 nm.

11. The method according to claim 1, wherein in step 2), the high dielectric constant gate dielectric film is sputtered in a mixed gas of $N_2$/Ar;
    and ratios of respective elements and film thickness can be adjusted by changing power and time for alternately sputtering the Hf target and the Si target.

* * * * *